INVENTOR.
CHARLES O. FEIGLESON
BY
Woody and Kintzinger
ATTORNEYS

April 22, 1969 C. O. FEIGLESON 3,440,645

ANALOG-TO-DIGITAL CONVERTER

Filed Aug. 4, 1965 Sheet 2 of 4

INVENTOR.
CHARLES O. FEIGLESON

BY Moody and Kintzinger
ATTORNEYS

INVENTOR.
CHARLES O. FEIGLESON

BY Moody and Kitzinger

ATTORNEYS

INVENTOR.
CHARLES O. FEIGLESON
BY
Moody and Kintzinger
ATTORNEYS

United States Patent Office 3,440,645

Patented Apr. 22, 1969

3,440,645

ANALOG-TO-DIGITAL CONVERTER

Charles O. Feigleson, Marion, Iowa, assignor to Collins Radio Company, Cedar Rapids, Iowa, a corporation of Iowa Filed Aug. 4, 1965, Ser. No. 477,111
Int. Cl. H04l 3/00
U.S. Cl. 340—347 13 Claims This invention relates in general to analog-to-digital signal conversion and, in particular, to an analog-to-digital conversion system utilizing two voltage controlled oscillators, one phase interlocked to the other, having a reference voltage input connection, and with the phase-locked oscillator maintained substantially at the reference frequency by a long-time constant reference input voltage holding circuit, and with each cycle of operation alternate connection of the other voltage controlled oscillator between a reference voltage source and an analog variable D.C. input source. The outputs of both of the voltage controlled oscillators in square-wave form are applied as high frequency square-wave input signals to a digital subtractor circuit from which an output is applied to a counter capable of converting the difference pulses to a binary representation for transfer to a digital output register or other utilizing circuitry.

Figures 1, 3, 4:
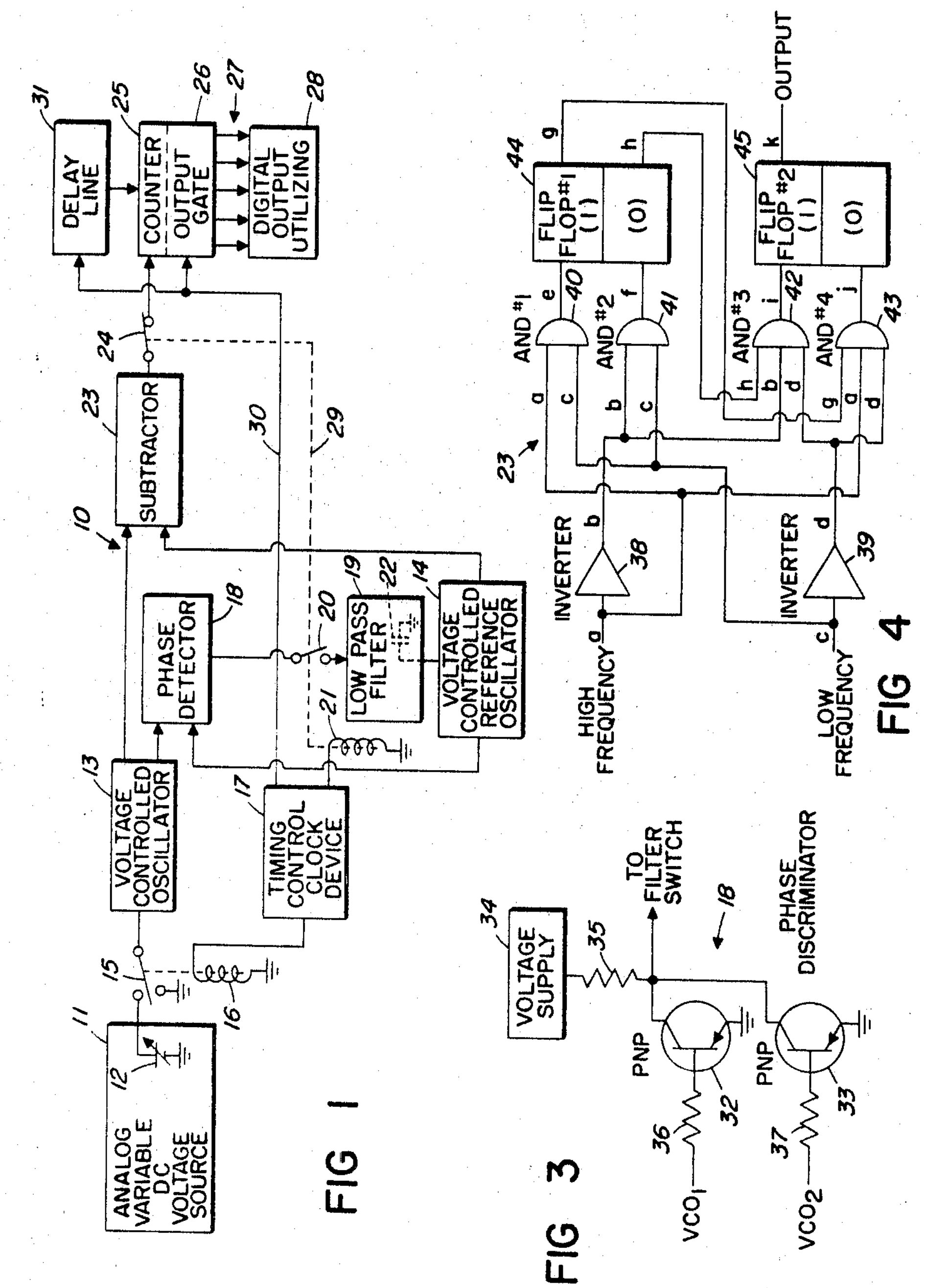

There are many possible uses for analog-to-digital converters, one being, for example, programmed aircraft flight simulation. In such programmed simulation digital information and control is generally more readily compatible with computer processing systems than are straight nonconverted analog information inputs.

It is, therefore, a principal object of this invention to provide an analog-to-digital signal conversion system utilizing alternate timing controlled D.C. reference voltage input switching to a voltage controlled oscillator circuit having two voltage controlled oscillators, or at least one voltage controlled oscillator and a phase controlled and stabilizing voltage controlled oscillator, and alternately control switching to receive an analog variable D.C. input signal to the voltage controlled oscillator circuit, and to obtain digital measurements thereof through measuring the change in frequency of a voltage controlled oscillator when a D.C. voltage is applied as an input thereto.

Another object is to provide analog D.C. signal to digital signal conversion through use of a freqeuncy shift principle.

Features of this invention useful in accomplishing the above objects include, use of the frequency shift of a voltage controlled oscillator as a voltage analog function duplicating an analog varied D.C. voltage signal source, and the use of a second voltage controlled oscillator as a reference frequency holding source enabling the analog-to-digital converting function. Logic circuitry is used, responsive to the phase advance of one frequency signal with respect to the other frequency signal out of the two voltage controlled oscillators, in a subtractor circuit functioning to convert the frequency relationships to digital outputs.

Furthermore, it should be noted that a voltage controlled oscillator has no threshold characteristic, and particularly with shifting to ground as a reference, various problems of conversion and calibration are substantially eliminated. One working embodiment features a two alternate channel analog input and had an eight bit address, seven bits plus sign, with accuracy limited substantially only by the linearity of voltage controlled oscillator shift. Hence, with substantially no theoretical limit to resolution, accuracy is extremely good. With these analog-to-digital converters time required to perform a conversion is depedent on the operating frequency of the voltage controlled oscillator and its frequency shift range. A working embodiment operated in the range of from 600 kc. to 660 kc. and was programed to give 75 conversions per second. Furthermore, the digital subtractor circuits used in the converter systems each generate an output signal whose frequency is equal to the difference of the two voltage controlled oscillator frequencies and with these two frequencies having a preknown and accepted operational relationship limitation in that one is always higher in frequency than the other and that the higher frequency is less than twice the lower frequency.

Specific embodiments representing what are presently known as the best modes of carrying out the invention are illustrated in the accompanying drawings.

Figure 2:
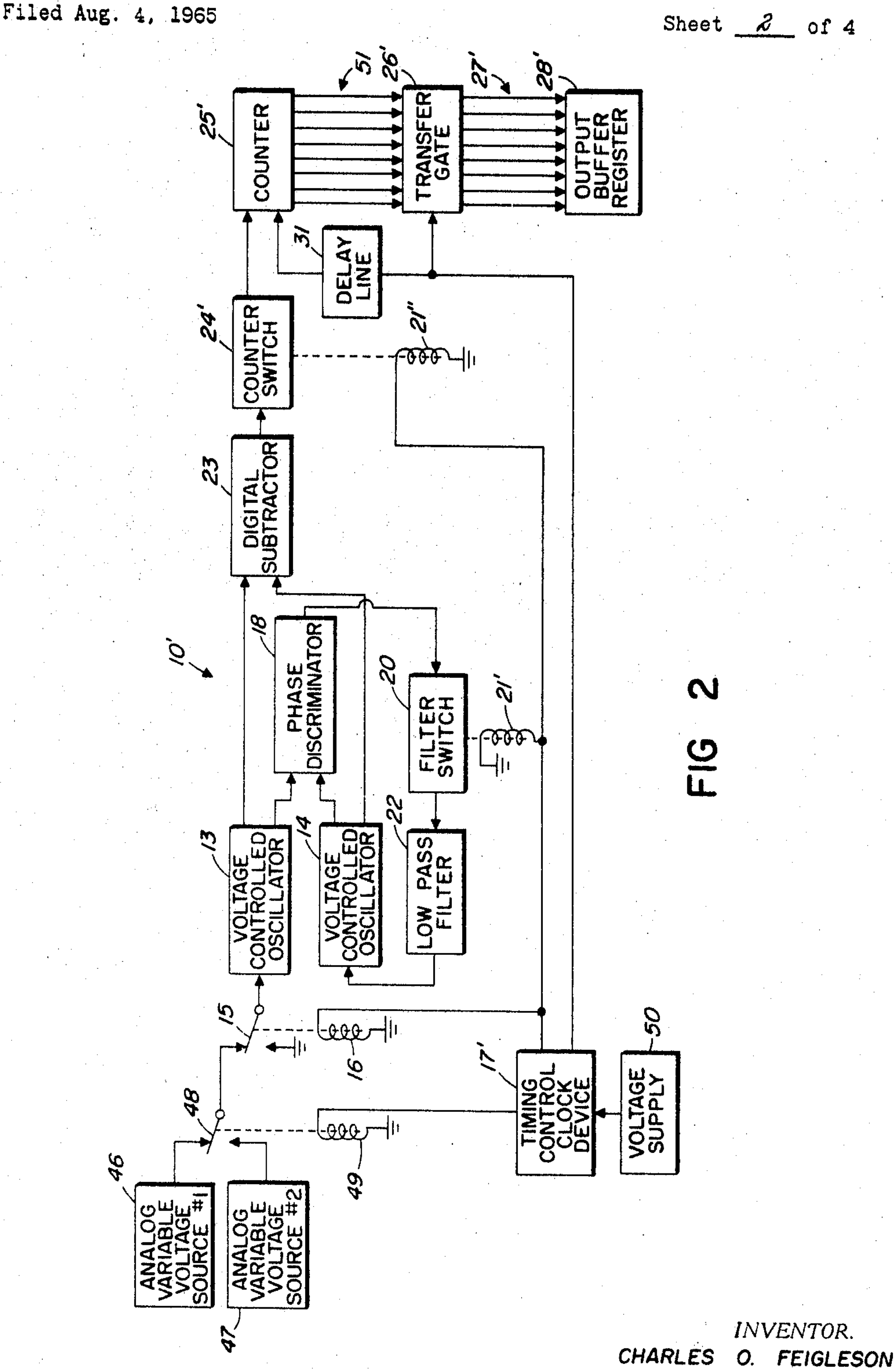
Figure 5:
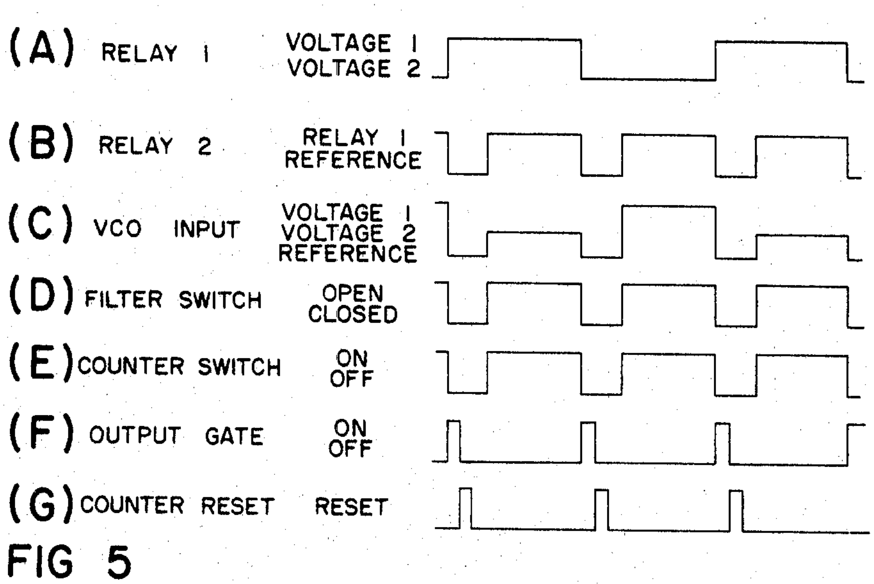
Figure 6A:
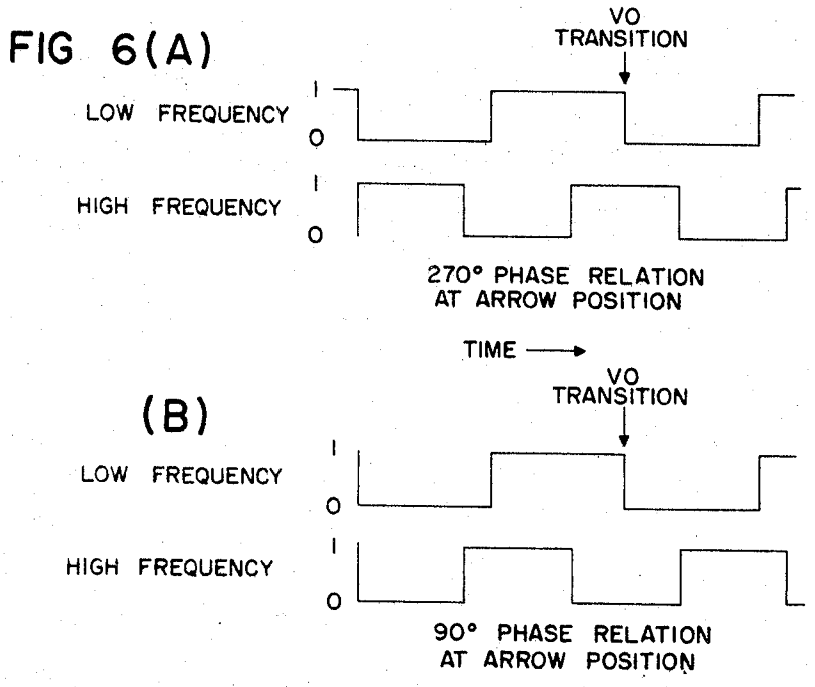
Figure 7:
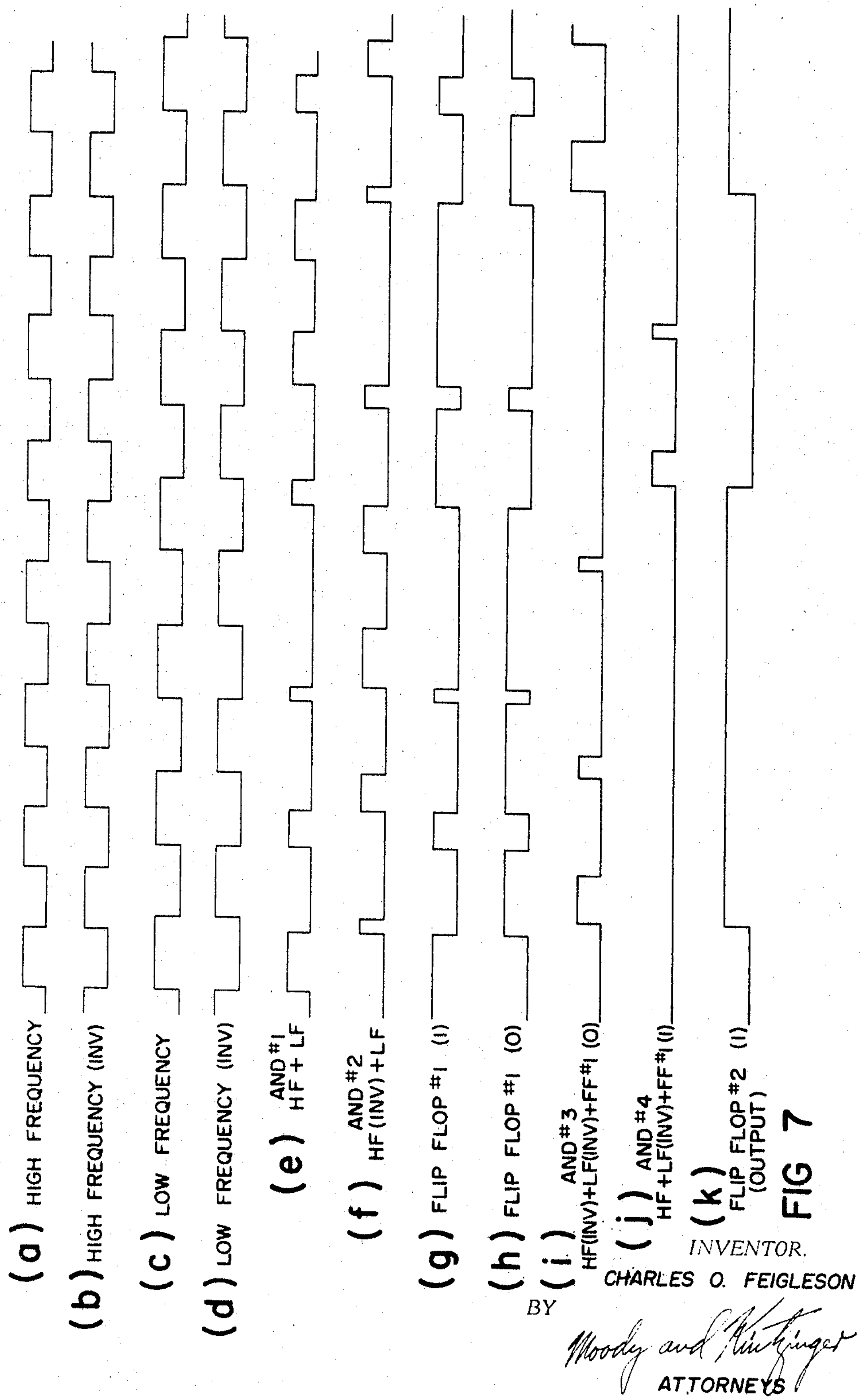

In the drawings:

FIGURE 1 represents a block diagram of an analog-to-digital converter system according to the invention;

FIGURE 2, a block diagram of an analog-to-digital converter having time controlled alternate analog variation voltage source inputs;

FIGURE 3, a schematic of a phase detector circuit;

FIGURE 4, a combination block diagram and schematic of the digital subtractor logic circuit;

FIGURE 5, clock timing voltage waveforms as controlled by the timing control clock device;

FIGURE 6, subtractor circuit input frequency waveforms illustrating in 6A a 270° phase relationship between the low and high frequency waveforms and in 6B the 90° phase relationship; and FIGURE 7, the family of waveforms including the input waveforms to the subtractor logic circuitry, waveforms at various points in the subtractor circuitry, and the ultimately used output waveform from the subtractor logic circuitry.

Referring to the drawings:

The analog-to-digital converter 10 of FIGURE 1 is shown to have, an analog variable D.C. voltage source 11 which may include a variable D.C. voltage level battery 12, a first voltage controlled oscillator 13, and a second voltage controlled oscillator 14, acting as a reference oscillator. A time controlled switch 15, alternately switched between the analog variable D.C. voltage source 11 and a voltage potential reference source, shown as ground in the illustrated embodiment, is provided between the analog variable D.C. voltage source 11 and voltage controlled oscillator 13. The switch 15 is shown to be a relay 16 actuated switch time controlled by an output from timing control clock device 17 although switch 15 could be time actuated by various other switch timing systems known to the art.

Voltage controlled oscillator 14 is part of a phase locked reference oscillator circuit including phase detector 18, a low pass filter 19, and a timing switch 20 in the connection between phase detector 18 and the low pass filter 19. Switch 20 is subject to timing control actuation by voltage timing signals, of an output from timing control clock device 17, actuating relay coil 21. An output of voltage controlled oscillator 13 is fed as an input to phase detector 18 and thereby as an input to the phase locked reference oscillator circuit. Another input to phase detector 18 is a feedback frequency output line connection from the voltage controlled oscillator 14. It should be noted that low pass filter 19 includes a reference voltage memory holding device, such as a capacitor 22 as indicated in phantom in the low pass filter block. An additional output from each of both the voltage controlled oscillators 13 and 14 have line connections as dual inputs to subtractor logic circuit 23.

The output of subtractor logic circuit 23 is passed to switch 24 and through the switch 24, when closed, as an input to counter circuit 25. The counter circuit 25 includes an output gate section 26 which is subject to activation in each cycle to pass the output of counter 25 through multiple lines 27 to digital output utilizing circuit 28.

Switch 24 is subject to simultaneous actuation with a switch 20 and may be provided with a common drive 29 as shown in FIGURE 1. The output gate 26 of counter circuit 25 is subject to timed actuation by a timing control waveform through a line 30 connected between the timing control clock device 17 and the output gate circuit 26. Immediately after the output gate circuit 26 has been activated and deactivated the counter circuit 25 must be reset. While this could entail a separate timing control clock device output line it is accomplished in the embodiment shown in FIGURE 1 by passing an extension of the timing control waveform line 30 through delay line 31 to the counter circuit 25.

Referring also to FIGURE 5, an output of timing control clock device 17 would be equivalent to timing control waveform B for control of relay 16 and switch 15. The filter switch control waveform D out of timing control clock device 17 is the actuating control waveform for relay 21 and switches 20 and 24. The output gate waveform F is the controlling waveform passed through line 30 for controlling output gate 26, and the counter reset waveform G is the resultant delayed output gate waveform through delay line 31 passed as a reset control input to counter circuit 25.

Referring also to FIGURE 3, a phase discriminator is shown in schematic form that could be used as the phase detector 18 in the FIGURE 1 embodiment or in like manner in the embodiment of FIGURE 2. This phase discriminator is shown to have dual PNP resistors 32 and 33 with the collectors of both connected in common to voltage bias supply 34 through resistor 35 and also in a common output connection to filter switch 20. The transistors 32 and 33 also have their emitters connected to ground, and have input connections, respectively, from voltage controlled oscillator 13 through resistor 36 to the base of transistor 32, and from voltage controlled oscillator 14 through resistor 37 to the base of transistor 33.

FIGURE 4 shows a subtractor logic circuit such as used as subtractor 23. This includes an input from voltage controlled oscillator 13 connected as a high frequency input to inverter circuit 38, and an input from voltage controlled oscillator 14 connected as a low frequency input to inverter circuit 39, although these frequencies could be interchanged. The subtractor logic circuit 28 also includes four AND gates 40, 41, 42, and 43 with the outputs of AND gates 40 and 41 connected as inputs to the "one" and the "zero" portions, respectively, of a first flip-flop circuit 44, and the outputs of AND gates 42 and 43 connected as inputs to the "one" and "zero" portions, respectively, of a second flip-flop 45. Further, the high frequency input connection from voltage controlled oscillator 13 is also connected as an input directly to AND gates 40 and 43, and the low frequency input from voltage controlled oscillator 14 is additionally connected directly as inputs to AND gates 40 and 41. The output of inverter circuit 38, receiving a high frequency input from voltage controlled oscillator 13, is connected as an input to both AND gates 41 and 42 while the output of inverter circuit 39, receiving a low frequency input from voltage controlled oscillator 14, is connected as an input to AND gates 42 and 43. Furthermore, the output of the "one" portion of the first flip-flop 44 is connected as an additional input to AND gate 43 and the output of the "zero" portion of flip-flop 44 is connected as an additional input to AND gate 42. The final output of subtractor circuit 23 is taken from the "one" portion of the second flip-flop 45.

The subtractor logic circuit 23 is devised to operate on the constantly changing phase relationship, such as illustrated in FIGURE 6A and FIGURE 6B, from one to the other. In operation the digital subtractor logic circuit 23 generates an output signal whose frequency is equal to the difference of two input frequencies with the preknown and accepted operational limitation that the two input frequencies be so related that one is higher in frequency than the other and that the higher frequency is less than twice the lower frequency. With these accepted predetermined limitations a principle of operation of the subtractor is to provide the desired output result by detecting when the phase relationship between the two frequencies is approximately 90° and when the phase relationship is approximately 270°. The output of the subtractor logic circuit 23 is set to "one" at the 90° relationship and to "zero" at the 270° relationship. As the phase of the high frequency signal advances with respect to the phase of the low frequency the output of the subtractor logic circuit alternates between "one" and "zero" at the difference frequency. Further important features are that voltage controlled oscillators 13 and 14 both produce square wave type frequency outputs. Furthermore, timing of the various operations, as controlled by controlling waveforms out of timing control clock 17, is of critical importance.

In order to more fully understand operation of the subtractor logic circuit 23 in an analog-to-digital converter, such as shown in FIGURE 1, and as used in the embodiment of FIGURE 2, please refer to FIGURE 7. Further, line locations that are the locations of the various waveforms of FIGURE 7 are marked, as a matter of convenience, with the same letters.

Waveform *a* represents high frequency square wave signal generated by voltage controlled oscillator 13 applied as an input to inverter circuit 38 and also as an input to AND gates 40 and 43. Waveform *b* is the output waveform inversion of waveform *a* out of inverter circuit 38 applied as an input to AND gates 41 and 42. The square wave low frequency output waveform *c* generated by voltage controlled oscillator 14 is applied as an input to inverter circuit 39 and also as an input to AND gates 40 and 41. Waveform *d* is the output waveform inversion of waveform *c* out of inverter circuit 39 applied as input to AND gates 42 and 43. Waveform *e* is the output waveform of the first AND gate 40 and is the resulting AND gate passed waveform of the high frequency and low frequency square waveforms *a* and *c*. Waveform *f* is the combined resultant output of the second AND gate 41 of square wave waveform input *b* and low frequency square wave input waveform *c*. Waveform *g* is the "one" portion square-wave output of the first flip-flop circuit 44, and square-wave waveform *h* is the waveform output of the "zero" portion of the first flip-flop circuit 44. Waveform *i* is the output waveform of the third AND gate 42 and is the resultant AND gate passed square-wave waveform of waveforms *h*, *b* and *d* applied as an input to the "one" portion of the second flip-flop 45. Waveform *j* is the output waveform of the fourth AND gate 43 and is the resultant AND gate passed square-wave waveform of the waveforms *g*, *a* and *d* applied as an input to the "zero" portion of the second flip-flop 45. Square-wave waveform *k* is the ultimately used output from the "one" portion of the second flip-flop 45 passed as an input to counter 25, although, alternately, the output of the "zero" portion of flip-flop 45 could be taken in providing substantially the same results.

Thus, a subtractor circuit 23 is provided that goes through one cycle each time the phase of the high frequency advances 360° with respect to the low frequency. This results in the digital subtractor generating one pulse per second for each cycle per second difference in the two voltage controlled oscillator output frequencies with the subtractor circuit developed output pulses being applied to counter 25 where the pulses are converted to a binary representation. It should be stressed that the timing controlling waveforms be very uniform to a high degree of accuracy and particularly so with respect to the actuation of switches 15, 20, and 24 in order that the operational results of the subtractor circuit 23 be highly uniform from cycle to cycle of operation. Further, the output gate 26 must be actuated during the switched off period of subtractor 23 and during the reference voltage switched input portion of each cycle and the counter reset cycle must follow the output gate activating pulse within the remaining duration of the reference voltage switch activated portion of each cycle. Further, it should be noted that switching to a ground potential voltage reference is particularly advantageous in substantially eliminating problems of conversion and calibration with respect to the voltage controlled oscillators. Were other voltage potential references to be employed as reference voltages aging of electronic components in the voltage controlled oscillators, particularly voltage controlled oscillator 13, could be significant in presenting periodic calibration and conversion problems. Other variable parameters that could be troublesome include environmental temperature variation and stray inductive signal pick-up factors, the effects of which are minimized by switching to a ground potential voltage reference.

Please refer now to FIGURE 2 of an analog-to-digital converter very similar in most respects to the embodiment of FIGURE 1 where duplicate components are numbered the same, those similar are provided with prime numbers, and those so differing as to be considered completely new additional elements given new numbers. In the embodiment of FIGURE 2 a first analog voltage reference source 46 and a second analog voltage reference source 47 are provided. In addition a switch 48 is provided for alternately connecting the analog variable sources 46 and 47 to relay actuated switch 15. Switch 48 is actuated from one position to the other by relay 49 subject to waveform, drive control, such as by waveform A of FIGURE 5, through an output connection of timing control clock device 17'. While it is assumed that the timing control clock device 17 of FIGURE 1 includes a voltage supply, a voltage supply 50 is shown for timing control clock device 17' in FIGURE 2. Furthermore, instead of the coil of relay 16 being driven by an independent output connection as shown in FIGURE 1 it is driven by a common output connection with the coil of relay 21'. Still further, instead of using a common mechanical drive from one relay coil for actuating both switches 20 and 24 an extension of the signal actuating line to the coil of relay 21' extends to the coil of an additional relay 21'' for actuation of the counter switch 24' between the subtractor circuit 23 and counter 25'. The transfer gate 26' is shown as a separate independent gate from counter 25' with multiple lines 51 interconnecting the counter and the transfer gate. The phase discriminator circuit 18 may be the same as that shown and described in FIGURE 3 and the digital subtractor circuit 23 is substantially the same circuitwise and functionally as that shown and described with respect to FIGURE 4 and the embodiment of FIGURE 1.

In operation of the FIGURE 2 embodiment, the first relay 48 is alternately actuated for equal periods as would be indicated by waveform A of FIGURE 5. The second relay 15 is so controlled by timing control clock device 17' as to split each of the cyclic periods of connection of the alternate analog voltage sources 46 and 47, as indicated by waveform B, into an initial reference voltage portion and an analog variable voltage input portion that is highly uniformly repetitive to a high degree of accuracy from cycle to cycle to provide a resultant voltage input waveform to voltage controlled oscillator 13 such as illustrated by waveform C. Obviously, relays 21' and 21'' are actuated by the common controlling waveform out of time control clock device 25 to give substantially the same operational controlling waveforms D and E as the B waveform provided for operation of switch 15. Obviously, the output gate portion must be triggered as by a square-wave control waveform F during the first part of the reference voltage switched portion of each cycle followed thereby before the end of the reference voltage switched portion of each cycle by a counter reset cycle activation control waveform G obtained by delay of control waveform F through delay line 31 as a reset control input to counter 25'.

Whereas, this invention is here illustrated and described with respect to specific embodiments thereof, it should be realized that various changes may be made without departing from the essential contribution to the art made by the teachings hereof.

I claim:

1. In an analog-to-digital converter for conversion of an analog varying D.C. signal from an analog variable D.C. voltage source to digital output form: a first voltage controlled oscillator; a phase controlled oscillator circuit connected to receive an input from said first voltage controlled oscillator; a voltage potential reference source; first switch means connected to the input of said first voltage controlled oscillator, and constructed to alternately switch connection between said analog variable D.C. voltage source and said voltage potential reference source; timing control means; means actuated by said timing control means for controlling switching control of said first switch means; second switch means in said phase controlled oscillator circuit; digital subtractor logic circuit means; said first voltage controlled oscillator having a connection for feeding the frequency output signal thereof as a first input to said digital subtractor logic circuit means; said phase controlled oscillator circuit having a connection for applying the output thereof as a second input to said digital subtractor logic circuit means; counter means connected for receiving the output of said digital subtractor logic circuit means as an input through means controlled for passing or blocking the signal path; output utilizing circuitry connected for receiving the output of said counter circuit through timing controlled gate means; and reset signal timing control input means, of said counter means, connected to said timing control circuit means for timed reset of said counter.

2. The analog-to-digital converter of claim 1, wherein said second switch means, said means controlled for passing or blocking the signal path between said subtractor logic circuit and said counter means, said timing controlled gate means, and said reset signal timing controlled input means are all connected to said timing control means for predetermined cyclic timed operation through each cycle of operation.

3. The analog-to-digital converter of claim 2, wherein a waveform signal delay line is connected between said reset signal timing control input means and the connection between said timing control means and said timing controlled gate means.

4. The analog-to-digital converter of claim 1, wherein said voltage potential reference source is ground.

5. The analog-to-digital converter of claim 1, wherein multiple analog variable D.C. voltage sources are connected to third switch means; said third switch means being in turn connected to said first switch means; switch actuating means for switching said third switch from analog variable D.C. voltage source to analog variable D.C. voltage source from operational cycle to cycle; and output means of said timing control means connected to said switch actuating means for predetermined timed cycle to cycle operation of said third switch means.

6. The analog-to-digital converter of claim 1, wherein said first and second switches and said means controlled for passing or blocking the signal path are relay thrown switches having connections with said timing control means for predetermined and selective timed pulse voltage waveform actuation of said switches.

7. The analog-to-digital converter of claim 1, wherein said phase controlled oscillator circuit includes: a phase detector circuit; a filter circuit; and a second voltage controlled oscillator; with a frequency output connection of said second voltage controlled oscillator back as a second input to said phase detector in addition to the input connection from said first voltage controlled oscillator; and with said second switch means connected in said phase controlled oscillator circuit for reference frequency activation thereof when said first switch means is activated for connection to said voltage potential reference source.

8. The analog-to-digital converter of claim 7, wherein said second switch means is located between said phase detector circuit and said filter circuit.

9. The analog-to-digital converter of claim 7, wherein both said first voltage controlled oscillator and said second voltage controlled oscillator are square wave frequency signal output oscillators.

10. The analog-to-digital converter of claim 7, wherein voltage value holding means is provided in said filter circuit.

11. The analog-to-digital converter of claim 1, wherein said digital subtractor logic circuit means includes: first and second signal inverter circuits; first, second, third, and fourth "and" gate circuits; and first and second flip-flop circuits; with, a first frequency input connection directly to the first signal inverter circuit, the first "and" gate circuit, and the fourth "and" gate circuit; a second frequency input connection directly to the second signal inverter circuit, the first "and" gate circuit, and the second "and" gate circuit; an output of the first signal inverter circuit is connected as an input to the second "and" gate circuit, and the third "and" gate circuit; an output of the second signal inverter circuit is connected as an input to the third "and" gate, and the fourth "and" gate; outputs of the first and second "and" gates are connected as inputs to opposite sides of the first flip-flop circuit; outputs of the opposite sides of the first flip-flop circuit are connected, one as an additional input to the third "and" gate circuit, and the other as an additional input to the fourth "and" gate circuit; outputs of the third and fourth "and" gates are connected as inputs to opposite sides of the second flip-flop circuit; and with an output from one side of said second flip-flop circuit being connected as the signal input source to said counter means.

12. The analog-to-digital converter of claim 11, wherein said digital subtractor logic circuit is limited to two frequency inputs having preknown relationships in that one frequency input is always higher in frequency than the other, and that the higher frequency is less than twice the lower frequency.

13. In an analog-to-digital converter for conversion of an analog varying D.C. signal from an analog variable D.C. voltage source to digital output form: a first voltage controlled oscillator; a second frequency generating circuit connected to receive an input through gate means from said first voltage controlled oscillator as a reference frequency controlling input signal during a portion of each operational cycle; a voltage potential reference source; first switch means connected to the input of said first voltage controlled oscillator, and constructed to alternately switch connection between said analog viariable D.C. voltage source and said voltage potential reference source; timing control means; means activated by said timing control means for controlling switching of said first switch means, and connection for activation of said gate means for the passing of signal voltage while said first switch means is connected to said voltage potential reference source during each cycle; digital subtractor logic circuit means; said first voltage controlled oscillator having a connection for feeding the frequency output signal thereof as a first input to said digital subtractor logic circuit means; said second frequency generating circuit having a connection for applying the output thereof as a second input to said digital subtractor logic circuit means; counter means connected for receiving the output of said digital subtractor logic circuit means as an input through means controlled for passing or blocking the signal path; output utilizing circuitry connected for receiving the output of said counter circuit through timing controlled gate means; and reset signal timing control input means, of said counter means, connected to said timing control circuit means for timed reset of said counter.

References Cited

UNITED STATES PATENTS

| | | | |
|---|---|---|---|
| 3,260,943 | 7/1966 | Huelsman et al. | 235—154 |
| 3,265,986 | 8/1966 | Wyckoff | 340—347 |
| 3,351,932 | 11/1967 | Hibbits et al. | 340—347 |
| 3,354,453 | 11/1967 | Hibbits et al. | 340—347 |
| 3,375,351 | 3/1968 | Deavenport et al. | 340—347 |

MAYNARD R. WILBUR, *Primary Examiner.*

WALTER W. NIELSEN, *Assistant Examiner.*